United States Patent [19]

Boutigny et al.

[11] Patent Number: 5,031,128

[45] Date of Patent: Jul. 9, 1991

[54] LOGIC ANALYZER WITH DOUBLE TRIGGERING ACTION

[75] Inventors: Pierre-Henri Boutigny, Epinay-sous-Senart; Huy A. Nguyen, Paris; Denis L. A. Raoulx, Grigny, all of France

[73] Assignee: U.S. Philips Corp., New York, N.Y.

[21] Appl. No.: 433,062

[22] Filed: Nov. 6, 1989

[30] Foreign Application Priority Data

Nov. 4, 1988 [FR] France ................ 88 14423

[51] Int. Cl.$^5$ .............................................. G06F 7/00
[52] U.S. Cl. .............................................. 364/715.11
[58] Field of Search ................ 364/715.11, 715.01; 340/146.2

[56] References Cited

U.S. PATENT DOCUMENTS

| | | | |
|---|---|---|---|
| 3,760,355 | 9/1973 | Bruckert | 364/715.11 |
| 4,375,635 | 3/1983 | Leow et al. | 340/146.3 |
| 4,404,542 | 9/1983 | Thomas, Jr. | 364/715.11 |
| 4,725,812 | 2/1988 | Kloppe | 364/715.11 X |
| 4,774,438 | 9/1988 | Rogers et al. | 315/392 |
| 4,829,462 | 5/1989 | Freeman et al. | 364/715.11 |
| 4,847,877 | 7/1989 | Besseyre | 364/715.11 X |

OTHER PUBLICATIONS

B. Comby, "L'Interet d'Une Acquisition en Temporel Transitionnel en Analyse Logique Rapide", Electronique Industrielle, No. 112, Sep. 15, 1986, Paris, pp. 55–63.
P. Dittman, "Logic Analyzers Simplify System Integration Tasks", Computer Design, Mar. 1981, pp. 55–63.

Primary Examiner—Gary V. Harkcom
Assistant Examiner—Tan V. Mai
Attorney, Agent, or Firm—Jack D. Slobod

[57] ABSTRACT

A logic analyzer for plural input channels generates trigger signals for first and second triggering modes selected by a multiplexer. In the first mode, a channel selector produces a detection signal in the form of a pulse when the plural input channels simultaneously have logic states matching a reference combination input to the channel selector. In the second mode, the channel selector produces a detection signal in the form of a pulse corresponding to the logic state of a channel selected by a channel selection signal input to the channel selector. The first mode triggering signal exhibits a digital transition when the pulse endures at least as long as a target time period determined by a target count times the interval between clock pulses while the second mode trigger signal exhibits a digital transition when the pulse terminates before enduring for the target time period.

4 Claims, 2 Drawing Sheets

5,031,128

LOGIC ANALYZER WITH DOUBLE TRIGGERING ACTION

BACKGROUND OF THE INVENTION
Description

The invention relates to a logic analyser comprising means for the detection of a reference combination in a combination of digital input signals selected by a channel selector.

An invention of this type is known from the patent document GB 2,060,182 which corresponds to U.S. Pat. No. 4,375,635 which discloses a logic analyser including a word recognizing arrangement. It includes a certain number of input channels and a word recognizer which enables the detection of a combination of bits which are simultaneously present on the input channels. This document relates more specifically to a possibility to extend the arrangement for combinations which exceed the number of input channels.

Such a logic analyser includes a trigger portion which permits of selecting the useful portion of the signal to be stored and to trigger stopping data acquisition when a certain event occurs. This possibility, called the vertical triggering action since the relevant event is the presence of a predetermined data word during a certain time interval. This triggering action is effected simultaneously on the N input channels.

But said document does not permit of effecting a different type of triggering which might facilitate the use of a logic analyser, namely a horizontal triggering action by means of which it is possible to detect combinations which are characteristic of a faulty functioning of an apparatus to be tested. The problem presented by the invention is therefore to realize a logic analyser which provides the possibility of employing either the vertical triggering or the horizontal triggering at user's option. The triggering action must act on one single input channel and must search for the presence of certain time sequences amongst the flow of input data. To reduce the manufacturing costs, it is furthermore necessary that this object is obtained with a reduced number of components.

The solution of the problems consists in that the detection means supply in accordance with two operating modes a trigger signal when the programmed reference combination is reproduced:

such that, in a first mode, the selected combination is formed by bits appearing at a given instant on different input channels, and, when the input signal combination is maintained during a period of time longer than a first predetermined period, the selector output signal starts a counter, under the control of a clock which is enabled by the output of the selector, in which a target value is loaded which defines the first predetermined value and, when this value has been reached an enable signal is supplied and stored in a first memory means, and such that, in a second mode, the selected combination is formed by identical bits which appear sequentially on the same channel during a period of time shorter than a second predetermined period, the selector output signal starting the counter in which a further target value is loaded and, when the duration of the selected combination is shorter than the second duration determined by the target value, another enable signal is supplied and stored in a second memory means, the mode selection being effected at the input with the aid of a channel control signal applied to the channel selector, and at the output with the aid of a mode signal applied to a multiplexer which receives the stored enable signals and supplies the trigger signal.

To effect the channel selection in accordance with the vertical or the horizontal triggering action, the selector comprises, assigned to each channel:

a first logic gate which receives a channel and one of the n bits of a first reference combination, the output of this first logic gate being connected to the input of a second logic gate which also receives one of the n bits of a second reference combination, one of the reference combinations being intended to select any binary word, the other reference combination being intended to select one of the n channels for forming the channel control channels, the second logic gates assigned to each channel having their outputs connected to a logic gate which effects the AND logic operations of all these outputs to produce the output signal of the selector.

Thus, all the programmed channels will be examined simultaneously to detect whether the reference combination has appeared during a predetermined period of time. Similarly, a single channel could be selected and examined over certain periods of time to detect whether the reference combination has appeared during a period of time less than a predetermined period. For the vertical triggering action the channel selector also effects the word recognition. Its output may be stored in a flip-flop for supply to the multiplexer. For the horizontal triggering action the word recognition is effected by the counter followed by its flip-flops.

BRIEF DESCRIPTION OF THE DRAWING

The invention and how it can be put into effect will be better understood on the basis of the following description which is given by way of non-limitative example with reference to the accompanying figures, in which.

DETAILED DESCRIPTION OF THE PREFERRED EMBODIMENTS

Figure 2:
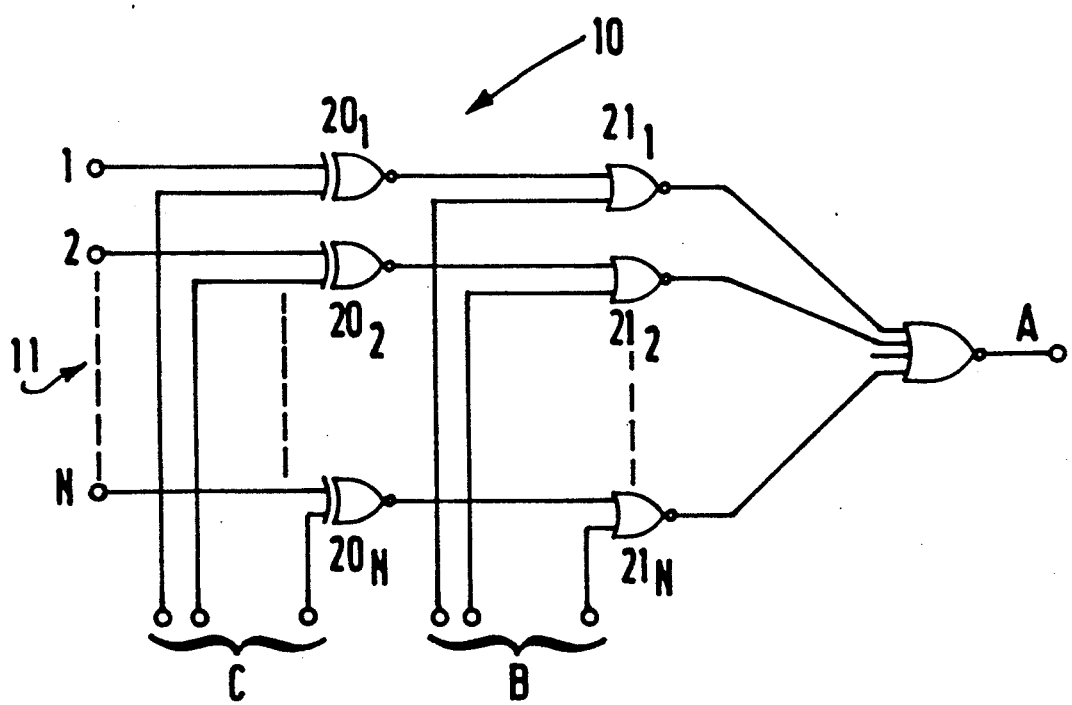
FIG. 2: is a detailed circuit diagram of a channel selector.

FIG. 2 shows the channel selector 10 which receives at the input bus 11 the input channels of the logic analyser. It receives a bit combination C which enables word recognition in accordance with the vertical triggering mode. It also receives a bit combination B enabling the selection of one channel amongst all the inputs of the logic analyser in accordance with the horizontal triggering mode.

Figure 1:
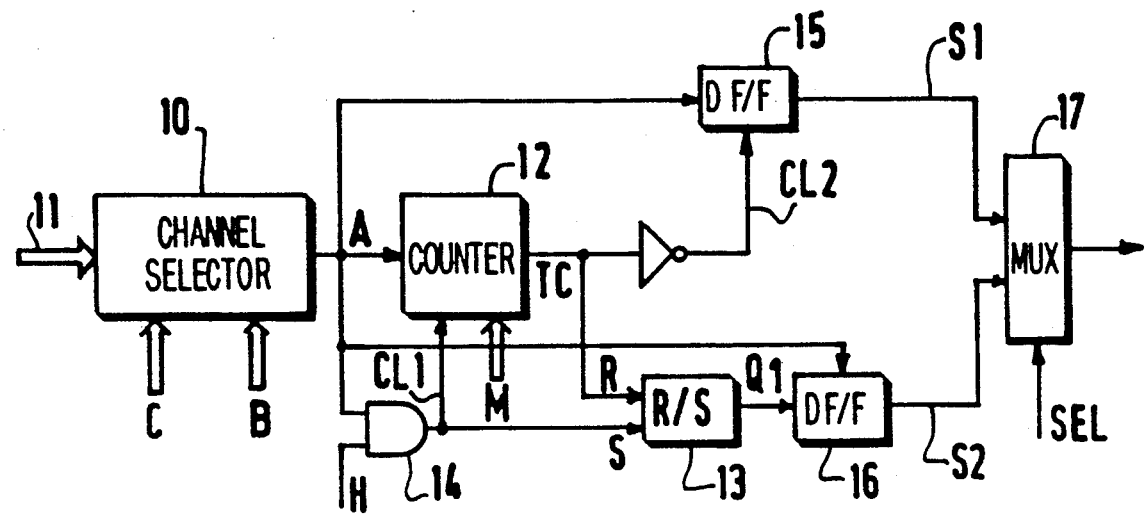
FIG. 1: is a circuit diagram of the detection means for a signal combination according to the invention.
Figure 3A:
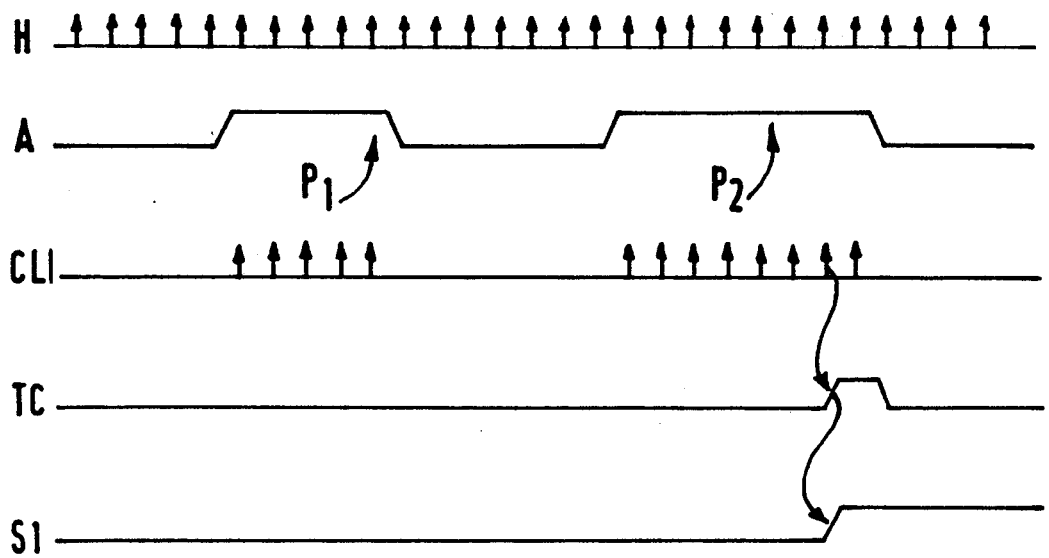
FIGS. 3A, 3B: show two timing diagrams corresponding to the circuit diagram of FIG. 1 for the two operating modes.

During vertical triggering when the reference combination has appeared simultaneously on the input channels, the signal in the point A changes to a given logic state, for example the 1 state. This operating mode is shown in FIG. 3A. When the signal A changes to the 1 state, the AND-gate 14 (FIG. 1) supplies a signal CL1 which serves as a clock signal for a counter 12. This counter has previously been loaded with a target value M which defines the predetermined duration. Thus, if, for example, M has been programmed for a duration of seven clock pulses, the change of A to the 1 state having a duration less than 7 clock pulses (case P1) will not cause any change of the output TC of the counter. In contrast thereto, when the signal A remains in the 1 state after a duration longer than seven clock pulses (case P2) this will cause the output TC to change to the logic 1 state and the output S1 of a D-type flip-flop 15 again follows and changes to the logic 1 state at the falling edge of the clock CL2.

Figure 3B:
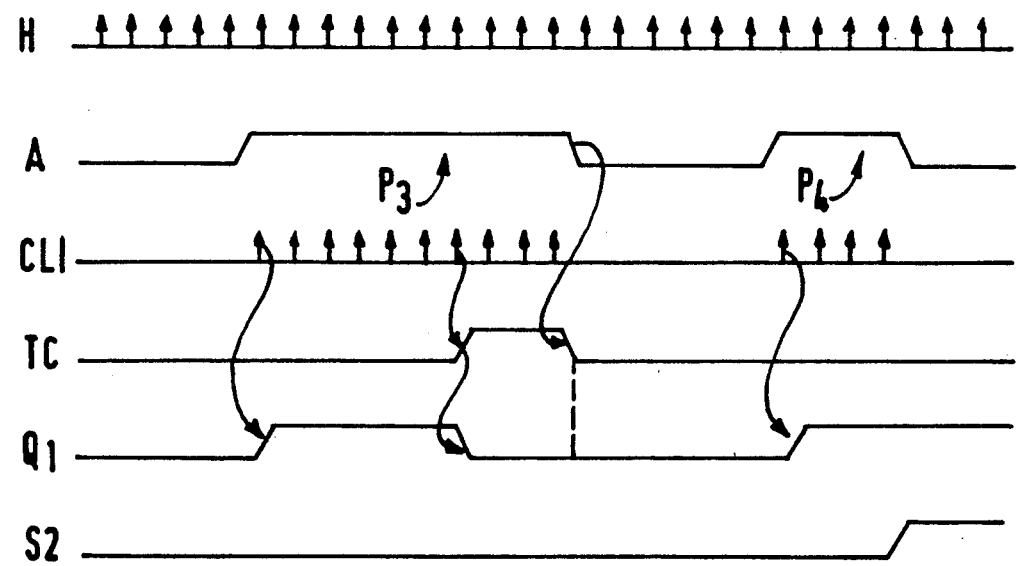

During horizontal triggering when a channel is selected the signal present on this channel will appear at the point A. Let it be assumed that the event to be detected causes a signal in the logic 1 state to appear at A (FIG. 3B). When the signal at A is in the logic 1 state, the clock CL1 changes to the logic 1 state and triggers the start of the counting action of the counter 12 which has previously been loaded with the target value M. The signal CL1 also activates an input of R/S-type flip-flop 13 and adjusts its output Q1 to the logic 1state. If the counter reaches the target value M (for example 7 clock pulses) before the signal A has changed its logic state (case P3) then the output TC causes the output Q1 of the R/S-type flip-flop 13 to change to the logic 0 state. When the descending edge of the signal A appears, it enables entry in the D-type flip-flop 16 of the signal Q1 to form a copy thereof at the output S2 of flip-flop 16.

When the signal A changes from the logic 1 state to the logic 0 state before the counter has reached the target value M (case P4), then the output TC has not changed to the logic 1 state and when the descending edge of A appears at the flip-flop 16, the output Q1 which has remained in the logic 1 state is recopied by the D-type flip-flop 16 at its output S2.

Thus, the multiplexer 17 can select the vertical or the horizontal mode with the aid of the signal SEL and supplies the trigging signal. This selection is preferably effected by programming the transistion of the signal SEL so as to provide that the two operating modes can successively be observed.

FIG. 2 shows the selector 10 of the channels 1, 2 ... N. The input bus 11 leads to logic gates $20_1$ ... $20_N$ which perform the inverse exclusive-OR function. These gates receive the reference combination C. Each of these gates has a logic 1 state at its output when there is a match between logic states at its inputs. Their outputs are combined in the logic gates $21_1, 21_2 ... 21_N$ which effect the NOR-function. These gates receive the reference combination B, a logic 0 state indicating selection of channels by the enablement of the gates associated with the channels. Their outputs are combined in one or a plurality of logic gates, in the example a NOR-gate. During vertical triggering, the combination B enables all the gates $21_1$ to $21_N$. When the input combination is identical to the reference combination C, the output A changes to the logic 1 state.

It will be obvious that for a person skilled in the art it is possible to work with an inverse logic by modifying the gate types used without departing from the scope of the invention.

The invention claimed is:

1. A logic analyzer for a plurality of input channels, said analyzer comprising:

channel selector means, having inputs for a reference combination signal, a channel selection signal, and said plurality of channels, and an output for a detection signal, for in a first mode producing a predetermined digital state in said detection signal in response to bits corresponding to said reference combination signal appearing simultaneously on respective different ones of said input channels, and for in a second mode producing said predetermined digital state in response to a bit appearing on a selected one of said channels, determined by said channel selection signal, said detection signal comprising a detection pulse when in said predetermined digital state;

trigger generating means for receiving a target value count, a clock signal and said detection signal and for producing a first mode trigger signal exhibiting a digital transition when said detection pulse endures for a target time period given by said target value count times the interval between clock pulses of said clock signal, and for producing a second mode trigger signal exhibiting a digital transition when a duration of said detection pulse terminates before enduring for said target time period; and mode selector means responsive to a mode selection signal for selecting said first mode trigger signal or said second mode trigger signal as a trigger signal for said analyzer.

2. The logic analyzer of claim 1, wherein said trigger generating means comprises a counter means for receiving said target value count and for receiving clock pulses of said clock signal only during the duration of said said detection pulse, and for issuing a counter pulse at an output of said counter means when said duration lasts for said target time period; a R/S memory means connected for being set at least by the first clock pulse following a leading edge of the duration of said detection signal and reset by a leading edge of said counter pulse; a first D-type memory means for receiving and detection signal as an input in response to a first enabling signal comprising the leading edge of said counter pulse, and output of said first D-type memory means supplying said first mode trigger signal; and a second D-type memory means for receiving an output of said R/S memory means in response to a second enabling signal comprising the trailing edge of said detection pulse, an output of said second D-type memory means supplying said second mode trigger signal.

3. A logic analyzer as claimed in claim 1, wherein said channel selector means comprises:

first logic gates, each first logic gate having a first input fed by a different input channel and a second input fed by a different bit position of said reference combination signal, each first logic gate having an output for exhibiting an output logic state indicative of a match between logic states at its first and second inputs;

second logic gates, each second logic gate having a first input fed by the output of a different first logic gate and a second input fed by a different bit position of said channel selection signal indicative of whether an associated channel is selected, each second logic gate having an output for exhibiting a predetermined output logic state if either the logic state at its first input is indicative of a match, or the logic state at its second input is indicative of the associated channel not being selected; and a third logic gate having plural inputs, each fed by an output of a different second logic gate and having an output for forming said detection signal exhibiting said predetermined digital state when the logic states at the plural inputs are indicative of a match or the associated channel not being selected.

4. The logic analyzer of claim 3, wherein said trigger generating means comprises a counter means for receiving said target value count and for receiving clock pulses of said clock signal only during the duration of said said detection pulse, and for issuing a counter pulse at an output of said counter means when said duration lasts for said target time period; a R/S memory means connected for being set at least by the first clock pulse following a leading edge of the duration of said detection signal and reset by a leading edge of said counter pulse; a first D-type memory means for receiving said detection signal as an input in response to a first enabling signal comprising the leading edge of said counter pulse, an output of said first D-type memory means supplying said first mode trigger signal; and a second D-type memory means for receiving an output of said R/S memory means in response to a second enabling signal comprising the trailing edge of said detection pulse, an output of said second D-type memory means supplying said second mode trigger signal.

* * * * *